United States Patent [19]
Imai

[11] Patent Number: 5,906,484
[45] Date of Patent: May 25, 1999

[54] VERTICAL CONTINUOUS OVEN

[75] Inventor: Kazuhiro Imai, Gunma-ken, Japan

[73] Assignee: Imai Seisakusho Co., Ltd., Japan

[21] Appl. No.: 08/471,355

[22] Filed: Jun. 6, 1995

[30] Foreign Application Priority Data

Jun. 7, 1994 [JP] Japan ................................. 6-7772 U

[51] Int. Cl.$^6$ ............................ F27B 9/00; F27D 3/00
[52] U.S. Cl. ........................ 432/121; 198/347.1; 198/775
[58] Field of Search .................................. 432/241, 5, 6,
432/121; 198/797, 347.1, 435, 463.3, 775;
414/941, 331

[56] References Cited

U.S. PATENT DOCUMENTS

| | | | |
|---|---|---|---|
| 2,325,889 | 8/1943 | Thompson et al. | 198/775 |
| 4,421,481 | 12/1983 | Holz et al. | 432/241 |
| 5,055,036 | 10/1991 | Asano et al. | 432/6 |
| 5,221,201 | 6/1993 | Yamaga et al. | 432/6 |
| 5,232,081 | 8/1993 | Kanamori | 198/347.1 |
| 5,253,743 | 10/1993 | Haas, Sr. et al. | 198/347.1 |
| 5,277,579 | 1/1994 | Takanabe | 432/6 |
| 5,350,050 | 9/1994 | Franke | 198/347.1 |
| 5,407,181 | 4/1995 | Ohsawa | 432/241 |
| 5,407,350 | 4/1995 | Iwabuchi et al. | 432/241 |
| 5,415,280 | 5/1995 | Balboni et al. | 198/435 |
| 5,473,978 | 12/1995 | Colombo | 198/347.1 |

*Primary Examiner*—Teresa Walberg
*Assistant Examiner*—Jiping Lu
*Attorney, Agent, or Firm*—Dickstein Shapiro Morin & Oshinsky LLP

[57] ABSTRACT

The continuous oven for baking planar works according to the present invention comprises an oven main body, a work lifting unit for conveying works upward inside the oven main body in a sequential manner; a work lowering unit for conveying works downward inside the oven main body in a sequential manner; whereby the works are baked while being conveyed by the work lifting and lowering units in a substantially vertical direction. Thus, the works are conveyed vertically most of the time during the stay in the oven, and the floor space area necessary for the installation of the continuous oven can be therefore minimized. In particular, by arranging the works one over the other, typically in a mutually spaced relationship, in the work lifting and lowering units, it is possible to minimize the dead space inside the oven. Also, by avoiding the profile of the oven from becoming elongated in any particular direction, it is possible to reduce the surface area of the oven main body for a given internal volume of the oven. This obviously is highly desirable in terms of the economy of thermal energy.

2 Claims, 6 Drawing Sheets

VERTICAL CONTINUOUS OVEN

TECHNICAL FIELD

The present invention relates to a continuous oven for baking or otherwise heating planar members for use in LCD panels, integrated circuit boards, and semiconductor devices.

BACKGROUND OF THE INVENTION

The conventional continuous oven typically consists of a so-called tunnel oven in which works typically consisting of planar electronic component parts are carried by a belt conveyor from an inlet end of the oven, and are discharged from an outlet end of the oven after being heated inside the oven while being thus conveyed. According to this conventional continuous oven, a plurality of works are conveyed in a single row, and are required to be kept inside the oven for a sufficient period of time. Therefore, in order to achieve a sufficient throughput, the overall length of the oven is required to be substantial, and a corresponding large floor space is required for the installation of the continuous oven.

BRIEF SUMMARY OF THE INVENTION

In view of such problems of the prior art, a primary object of the present invention is to provide an improved continuous oven which can achieve a high throughput without requiring the overall length of the oven to be excessive.

A second object of the present invention is to provide an improved continuous oven which can reduce the overall length without complicating the structure for conveying the works.

According to the present invention, these and other objects can be accomplished by providing a continues oven for baking planar works, comprising: an oven main body defining an oven chamber therein and provided with means for maintaining a high temperature environment inside the oven chamber; a work lifting unit for conveying works upward inside the oven chamber with the works stacked one over the other in a mutually spaced relationship; a work lowering unit for conveying works downward inside the oven chamber with the works stacked one over the other in a mutually spaced relationship; a work charging unit provided in a lower part of one side of the oven main body for charging each work into a lower end of the work lifting unit from an inlet end of the oven main body; a work shifting unit provided in an upper part of the oven main body for moving each work from an upper end of the work lifting unit to an upper end of the work lowering unit; and a work discharging unit for discharging each work from a lower end of the work lowering unit out of an outlet end of the oven main body.

According to a different aspect of the present invention, there is provided a continues oven for baking planar works, comprising: an oven main body defining an oven chamber therein and provided with means for maintaining a high temperature environment inside the oven chamber; a work lifting unit for conveying works upward inside the oven chamber in a sequential manner; a work lowering unit for conveying works downward inside the oven chamber in a sequential manner; whereby the works are baked while being conveyed by the work lifting and lowering units in a substantially vertical direction.

Thus, the works are conveyed vertically most of the time during the stay in the oven, and the floor space area necessary for the installation of the continuous oven can be therefore minimized. In particular, by arranging the works one over the other, typically in a mutually spaced relationship, in the work lifting and lowering units, it is possible to minimize the dead space inside the oven. Also, by avoiding the profile of the oven from becoming elongated in any particular direction, it is possible to reduce the surface area of the oven main body for a given internal volume of the oven. This obviously is highly desirable in terms of the economy of thermal energy.

According to a preferred embodiment of the present invention, the work lifting unit comprises; a plurality of work supporting shafts each disposed vertically, and adapted to be selectively turned by a certain angle around an axial line thereof; a plurality of work supporting arms extending laterally from each of the work supporting shafts at prescribed elevations and at an equal interval, the supporting arms at each same elevation being adapted to support one of the works in cooperation with each other when the work supporting shafts are turned to an operative position, and stay out of a vertical path of travel of the works when the work supporting shafts are turned to a retracted position; a plurality of work lifting shafts each disposed vertically, and adapted to be turned by a certain angle and vertically moved by a stroke at least slightly larger than the equal interval; and a plurality of work lifting arms extending laterally from each of the work lifting shafts at prescribed elevations and at a same equal interval as the work supporting arms, the work lifting arms at each same elevation being adapted to support one of the works in cooperation with each other when the work lifting shafts are turned to an operative position, and stay out of a vertical path of travel of the works when the work lifting shafts are turned to a retracted position.

Similarly, the work lowering unit comprises; a plurality of work supporting shafts each disposed vertically, and adapted to be selectively turned by a certain angle around an axial line thereof; a plurality of work supporting arms extending laterally from each of the work supporting shafts at prescribed elevations and at an equal interval, the work supporting arms at each same elevation being adapted to support one of the works in cooperation with each other when the work supporting shafts are turned to an operative position, and stay out of a vertical path of travel of the works when the work supporting shafts are turned to a retracted position; a plurality of work lowering shafts each disposed vertically, and adapted to be turned by a certain angle and vertically moved by a stroke at least slightly larger than the equal interval, and a plurality of work lowering arms extending laterally from each of the work lowering shafts at prescribed elevations and at a same equal interval as the supporting arms, the work lowering arms at each same elevation being adapted to support one of the works in cooperation with each other when the work lowering shafts are turned to an operative position, and stay out of a vertical path of travel of the works when the work lowering shafts are turned to a retracted position.

Thus, by turning and lifting the work lifting arms and the work lowering arms while the work supporting arms are turned in response to the movements of the work lifting arms and the work lowering arms, it is possible to move the works from one set of arms to the other, either upward or downward, in a sequential manner. Also, the structure for effecting a vertical conveying action can be achieved in a highly simple manner.

According to a particularly preferred embodiment of the preset invention, a base supports the oven main body in a middle part thereof, and is incorporated with the means for a high temperature environment inside the oven chamber. The work charging unit and the work discharging unit may also be carried by the parts of the base adjacent to the inlet and outlet ends of the oven main body.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
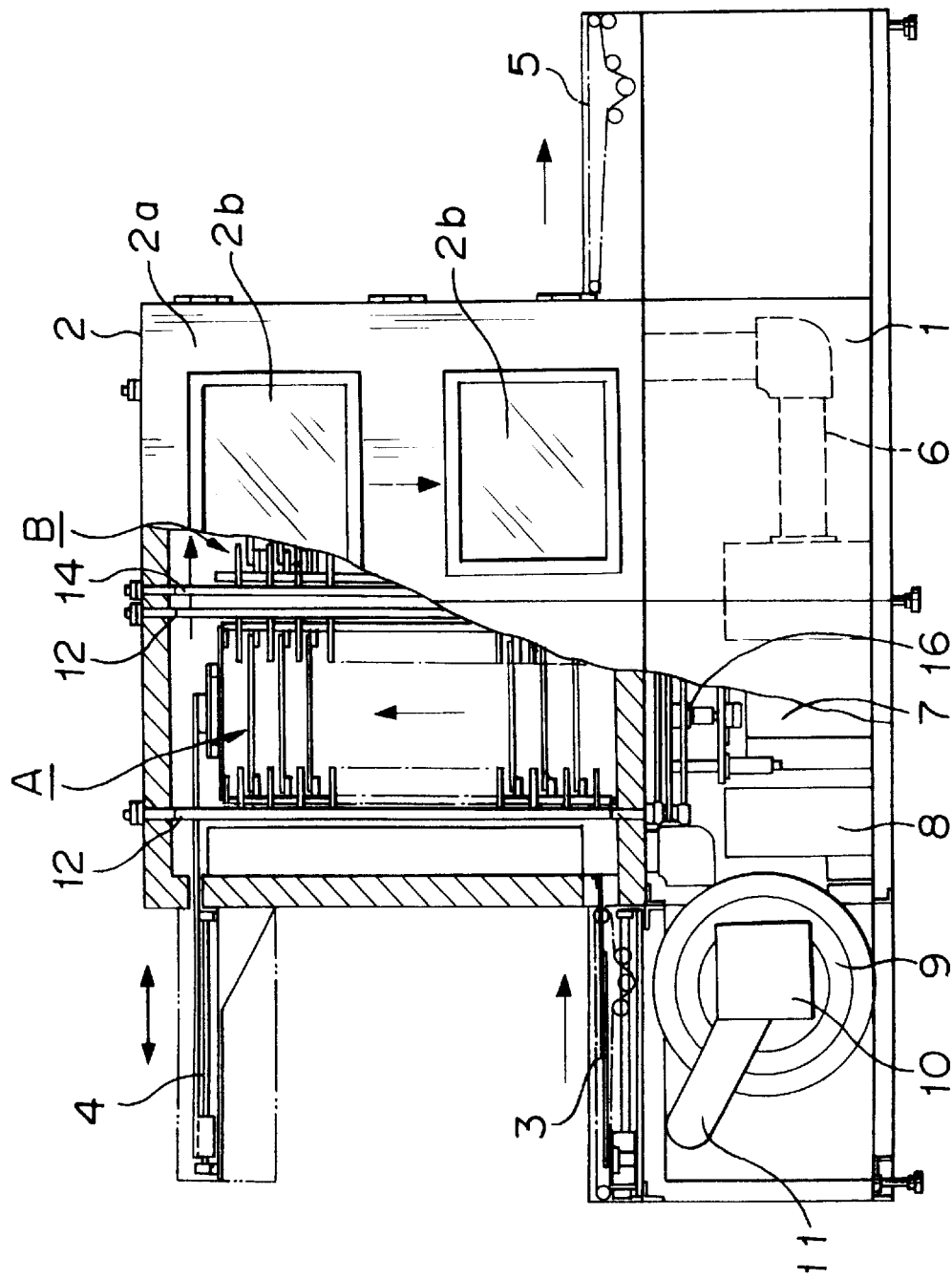
FIG. 1 is a partly broken away front view a preferred embodiment of the continuous oven according to the present invention.
Figure 2:
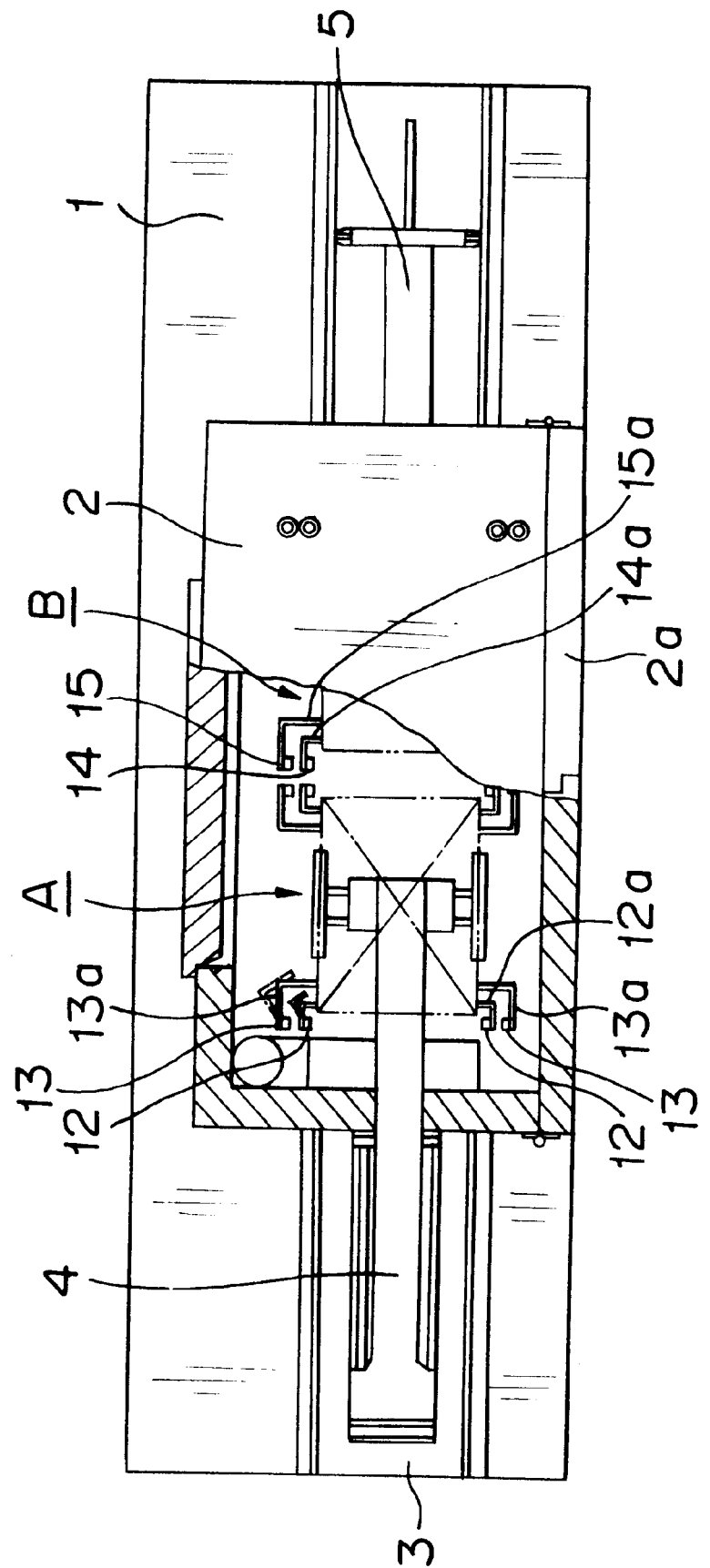
FIG. 2 is a horizontal sectional view of an upper part of the continuous oven.
Figure 3:
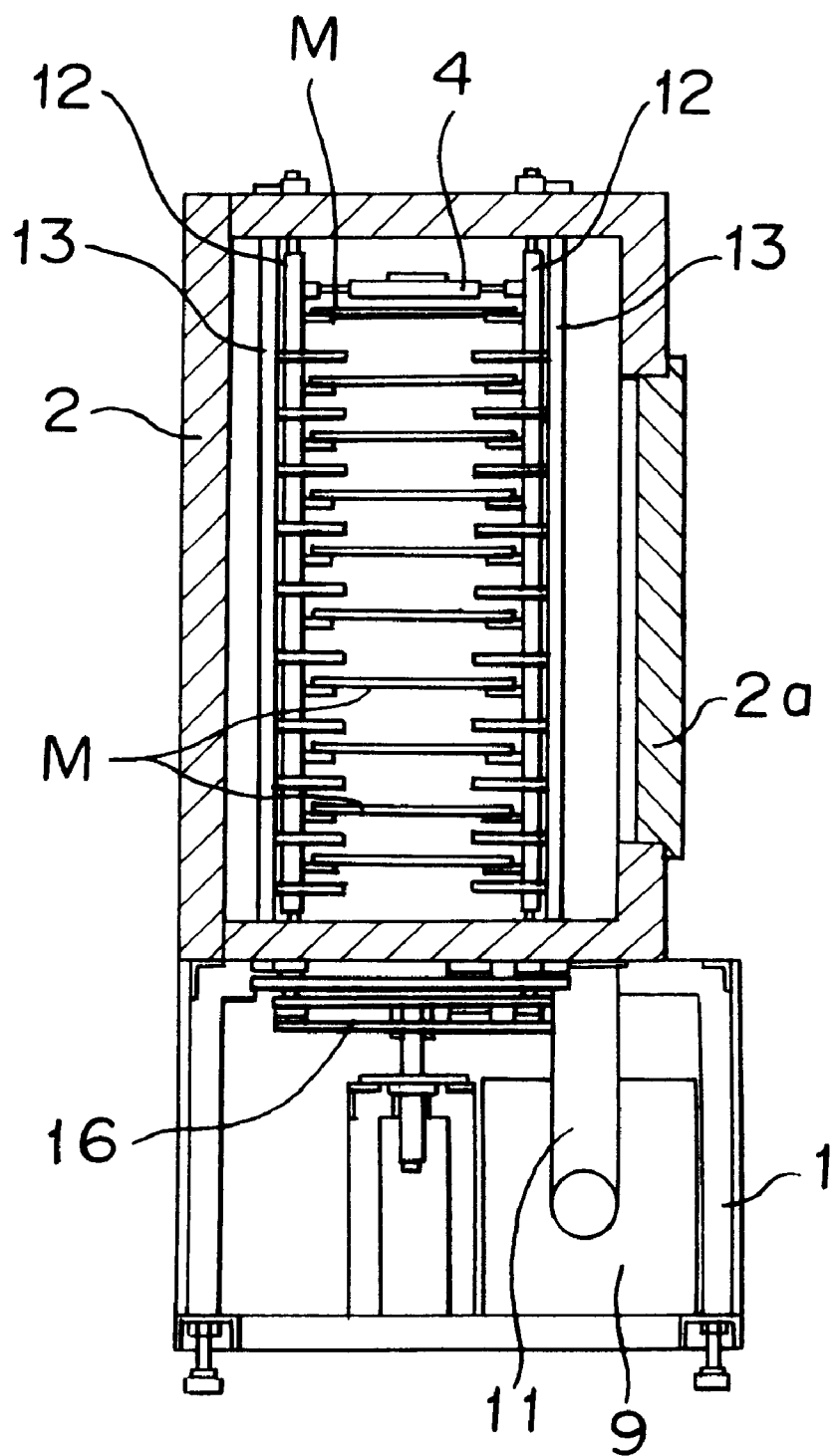
FIG. 3 is a vertical sectional view of the work lifting unit.

Referring to FIGS. 1 to 3, the continuous oven according to the present invention comprises a base 1, and an oven main body 2 mounted centrally on the base 1. The works M intended to be baked in this continuous oven each consist of a rectangular plate member.

The oven main body 2 comprises an inlet on one side thereof for charging works to be baked, and an outlet on the other side thereof for discharging baked works. A work charging unit 3 is provided in association with the inlet, and a work shifting unit 4 is provided in an upper part of the oven main body 2 above the inlet. A work discharging unit 5 consisting of a belt conveyor is provided in association with the outlet. The oven main body 2 comprises a pair of vertical sections disposed adjacent to the inlet and outlet, respectively. The inlet section is provided with a work lifting unit A for sequentially lifting the works M while the outlet section is provided with a work lowering unit B for sequentially lowering the works M. The front side of the oven main body 2 is normally closed by a door 2a having glazed inspection windows 2b.

The base 1 is incorporated with a supply duct 6, a filter case 7, a heater box 8, a blower 9, a de-mister 10, and an intake duct 11 for supplying heated air of a prescribed temperature into the interior of the oven main body 2, and bake the works M which are being conveyed inside the oven main body 2.

Figure 4:
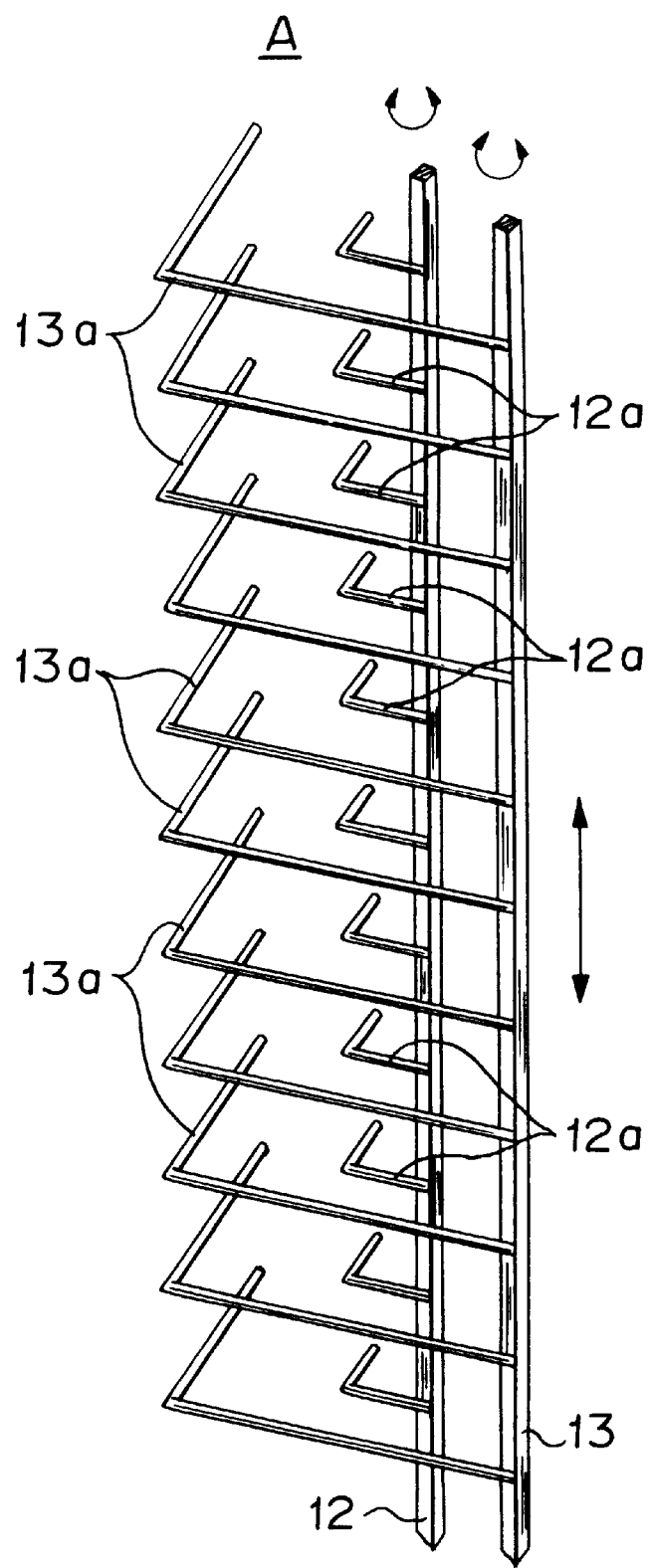
FIG. 4 is a fragmentary perspective view of a part of the work lifting unit.
Figure 5:
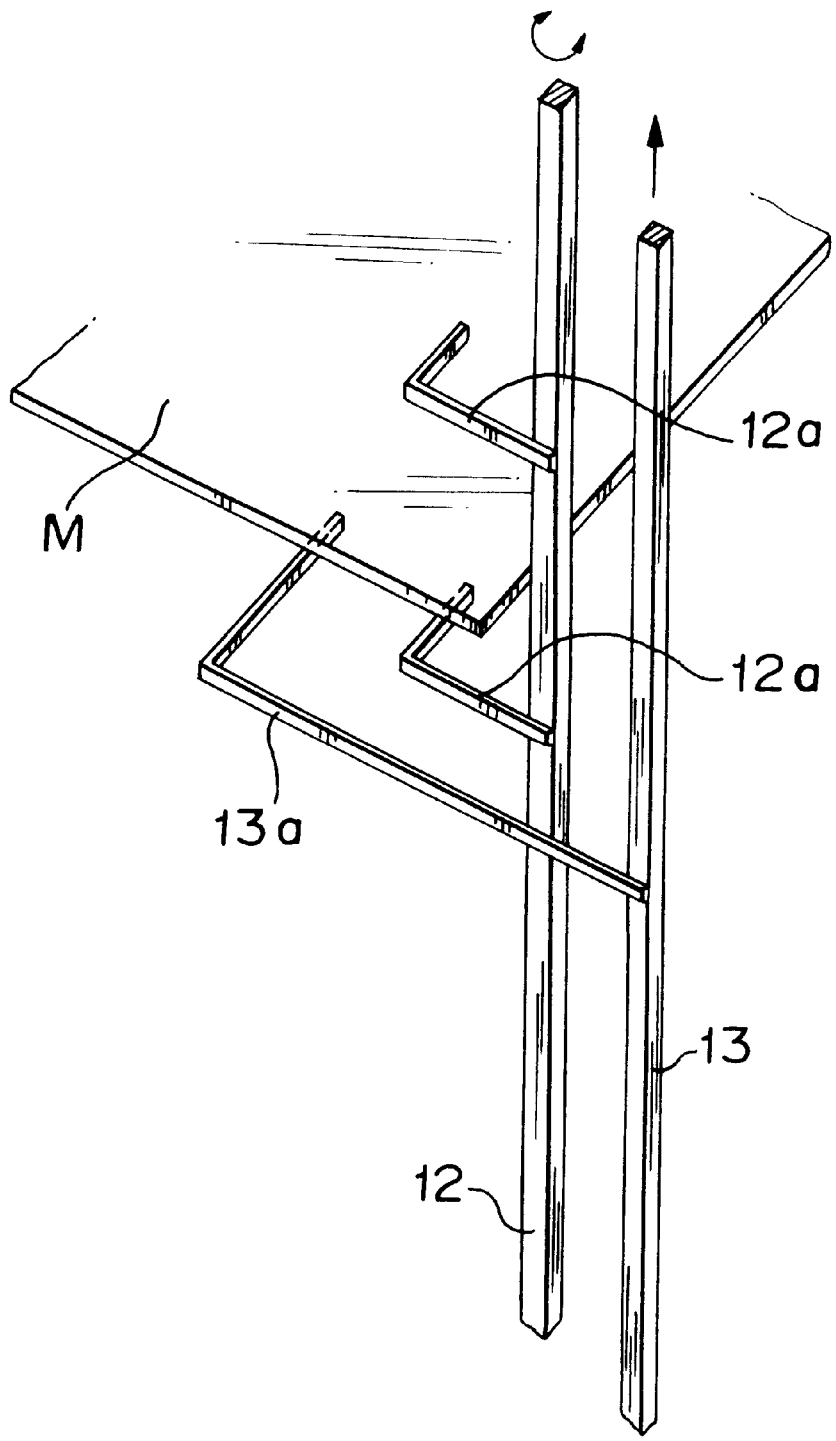
FIG. 5 is a fragmentary perspective view of a part of the work lifting unit showing how a work M is supported by the work supporting arms and the work lifting arms.
Figure 6:
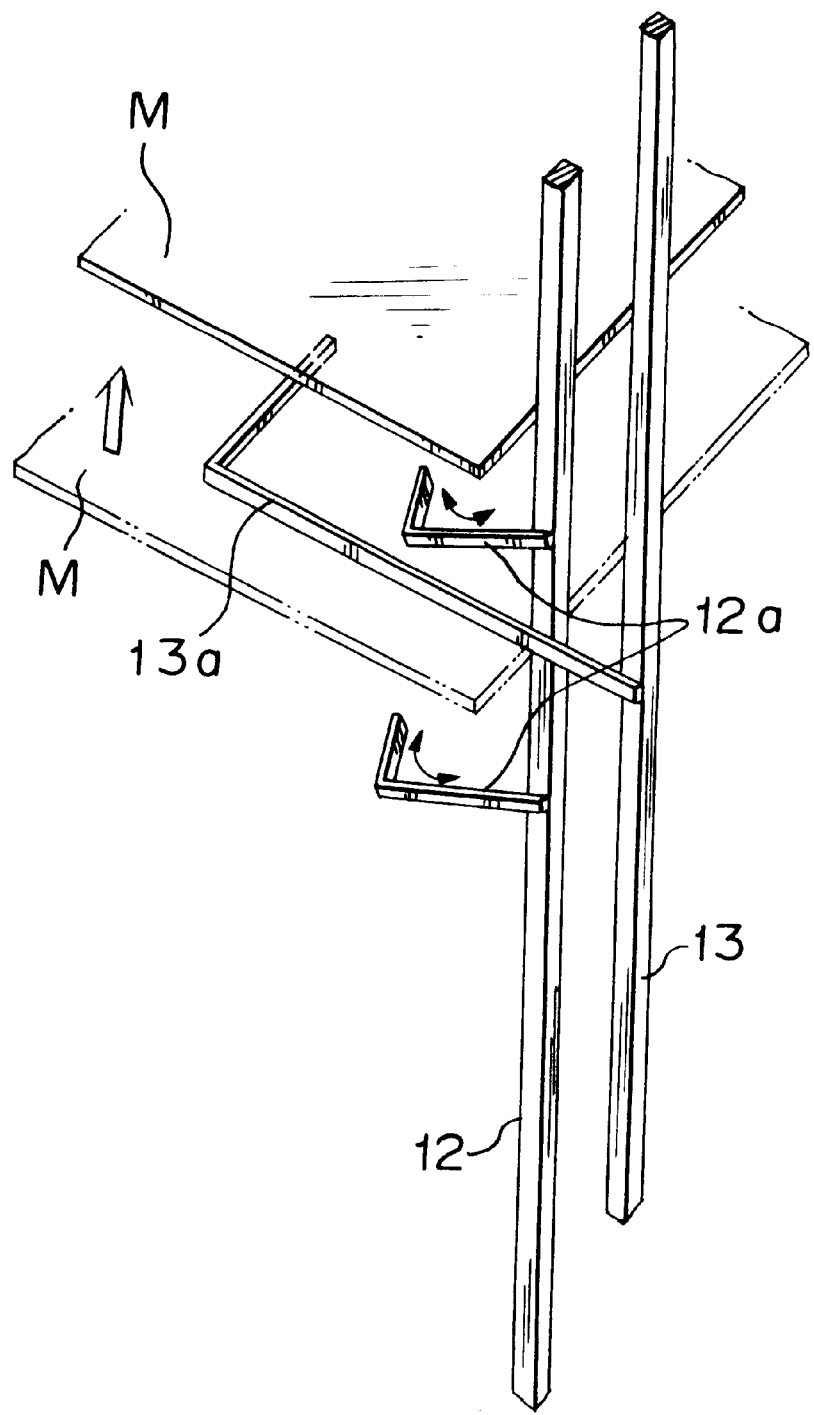
FIG. 6 is a view similar to FIG. 5 when the work supporting arms are turned to the retracted position.

FIGS. 4 to 6 show the work lifting unit A in more detail. This unit comprises four supporting shafts 12 for supporting the works, and four lifting shafts 13 for lifting the works.

Each of the supporting shafts 12 is provided with a plurality of work supporting arms 12a each adapted to abut an associated corner portion of a lower surface of each work so that the work may be supported in a substantially horizontal orientation by four corresponding work supporting arms 12a carried by the four supporting shafts 12 at a same elevation. Each of the supporting shafts 12 can be turned by approximately 90 degrees around its axial center line so that work supporting arms 12a can be moved between the operative position for supporting the works and the retracted position moved away from the works.

Similarly, each of the work lifting shafts 13 is provided with a plurality of work lifting arms 13a each adapted to abut an associated corner portion of a lower surface of each work so that the work may be supported in a substantially horizontal orientation by four corresponding work lifting arms 13a carried by the four lifting shafts 13 at a same elevation. Each of the lifting shafts 13 can be turned by approximately 90 degrees around its axial center line so that work lifting arms 13a can be moved between the operative position for lifting the works and the retracted position moved away from the works. Furthermore, the lifting shafts 13 can be lifted and lowered along its axial line.

How the work lifting unit A operates is now described in the following. Initially, the work supporting arms 12a are each placed at its operative position, and are engaged with the associated corner portions of the works. The work lifting arms 13a are also each placed at its operative position at a slightly lower elevation than the associated work supporting arm 12a as illustrated in FIG. 5. The work lifting arms 13a are then raised until the works are supported solely by the work lifting arms 13a, and the work supporting arms 12a now made idle are each turned into its retracted position. The work lifting arms 13a are each further raised to an elevation slightly higher than the next higher associated work supporting arms 12a. The work supporting arms 12a are turned, and brought back again to their operative position. The work lifting arms 13a are then lowered until the works are supported solely by the work supporting arms 12a. Thereafter, the work lifting arms 13a are turned to their retracted position, lowered back to the initial height, and then turned again back to their operative position at a slightly lower elevation than the associated work supporting arms 12a. By repeating this process, it is possible to lift the works one step at a time.

The work lowering unit B is similar in structure to the work lifting unit A, but lowers the works one step at a time by reversing the operation of the work lifting unit A.

More specifically, this unit comprises four supporting shafts 14 for supporting the works, and four lowering shafts 15 for lowering the works.

Each of the work supporting shafts 14 is provided with a plurality of work supporting arms 14a each adapted to abut an associated corner portion of a lower surface of each work so that the work may be supported in a substantially horizontal orientation by four corresponding work supporting arms 14a carried by the four supporting shafts 14. Each of the supporting shafts 14 can be turned by approximately 90 degrees around its axial center line so that work supporting arms 14a can be moved between the operative position for supporting the works and the retracted position moved away from the works.

Similarly, each of the work lowering shafts 15 is provided with a plurality of work lowering arms 15a each adapted to abut an associated corner portion of a lower surface of each work so that the work may be supported in a substantially horizontal orientation by four corresponding work lowering arms 15a carried by the four work lowering shafts 15. Each of the work lowering shafts 15 can be turned by approximately 90 degrees around its axial center line so that work lowering arms 15a can be moved between the operative position for lowering the works and the retracted position moved away from the works. Furthermore, the work lowering shafts 15 can be lifted and lowered.

How the work lowering unit B operates is now described in the following. Initially, the work supporting arms 14a are each placed at its operative position, and are engaged with the associated corner portions of the works. The work lowering arms 15a are also each placed at its operative position at a slightly lower elevation than the associated work supporting arm 14a. The work lowering arms 15a are then raised until the works are supported solely by the work lowering arms 15a, and the work supporting arms 14a now made idle are each turned into its retracted position. The work lowering arms 15a are then each lowered to an elevation slightly higher than the next lower associated work supporting arms 14a. The work supporting arms 14a are each turned, and brought back again to its operative position. The work lowering arms 15a are then lowered until the works are supported solely by the work supporting arms 14a. Thereafter, the work lowering arms 15a are turned to their retracted position, raised back to the initial height, and then turned again back to their operative position at a slightly lower elevation than the associated work supporting arms 14a. By repeating this process, it is possible to lower the works one step at a time.

Referring to FIG. 1, each work M is charged into the oven main body 2 by the charging unit 3, and is initially placed on the lowermost supporting arms 13a. At this time point, the lowermost work lifting arms 12a are at a slightly lower elevation than the lowermost work supporting arms 13a. The above mentioned lifting movement of the lifting arms 12a and the supporting arms 13a are carried out in a sequential manner in synchronism with the operation of the charging unit 3. The work carried by the uppermost supporting arms 13a of the work lifting unit A is pushed sideways by the work shifting 4 unit, and is moved onto the uppermost supporting arms 15a of the work lowering unit B. If necessary, the working end of the work shifting unit 4 may be guided so as to involve a certain vertical movement in synchronism with the horizontal movement thereof so that the work may be lifted slightly from the supporting arms 13a of the work lifting unit A before it is conveyed sideways, and again lowered onto the supporting arms 15a of the work lowering unit B at the end of the sliding movement of the work.

The work is then lowered in a sequential manner down the work lowering unit B, and the work which has reached the bottom end of the work lowering unit B is carried out of the oven main body 2 by the discharging unit 5. The movements of the charging unit 2, the work lifting unit A, the work shift unit 4, the work lowering unit B, and the discharging unit 5 are all synchronized so that the time period of stay in the oven main body 2 may be the same for all of the works.

Thus, according to the present invention, a primary section of the continuous oven is disposed vertically, and the works are therefore stacked one over the other. Thus, as opposed to the conventional continuous oven in which the works are arranged in a single row along the horizontal conveying direction, the overall length of the continuous oven can be substantially reduced. Furthermore, with the works placed one over the other, it is possible to reduce any dead space inside the oven main body, and this is highly advantageous in terms of the economy of thermal energy. The reduction in the overall length of the oven is also beneficial in terms of the economy of thermal energy through reduction in the surface area for a given internal volume of the oven.

Also, the vertical conveying units for the work lifting unit A and the work lowering unit B are basically simple in structure, and can be made more simple and economical than the long belt conveyer that is required in the conventional continuous oven.

Although the present invention has been described in terms of a specific embodiment thereof, it is possible to modify and alter details thereof without departing from the spirit of the present invention.

What I claim is:

1. A continuous oven for baking planar works, comprising:
   an oven main body defining an oven chamber therein and provided with means for maintaining a high temperature environment inside said oven chamber;
   a work lifting unit for conveying works upward inside said oven chamber with said works stacked one over the other in a mutually spaced relationship, wherein said work lifting unit includes
      a plurality of work supporting shafts each disposed vertically, and adapted to be selectively turned by a certain angle around an axial line thereof, at least one of said plurality of work supporting shafts being arranged at a front end of said works and a remainder of said plurality of work supporting shafts being arranged at a rear end of said works;
      a plurality of work supporting arms extending laterally from each of said work supporting shafts at prescribed elevations and at an equal interval, each of said work supporting arms having an L-shape, said supporting arms at each same elevation being adapted to support one of said works in cooperation with each other when said work supporting shafts are turned to an operative position, and stay out of a vertical path of travel of said works when said work supporting shafts are turned to a retracted position;
      a plurality of work lifting shafts each disposed vertically, and adapted to be turned by a certain angle and vertically moved by a stroke at least slightly larger than said equal interval, at least one of said plurality of work lifting shafts being arranged at the front end of said works and a remainder of said plurality of work lifting shafts being arranged at the rear end of said works; and
      a plurality of work lifting arms extending laterally from each of said work lifting shafts at prescribed elevations and at a same equal interval as said work supporting arms, each of said work lifting arms having an L-shape, said work lifting arms at each same elevation being adapted to support one of said works in cooperation with each other when said work lifting shafts are turned to an operative position, and stay out of a vertical path of travel of said works when said work lifting shafts are turned to a retracted position;
   a work lowering unit for conveying works downward inside said oven chamber with said works stacked one over the other in a mutually spaced relationship;
   a work charging unit provided in a lower part of one side of said oven main body for charging each work into a lower end of said work lifting unit from an inlet end of said oven main body;
   a work shifting unit provided in an upper part of said oven main body for moving each work from an upper end of said work lifting unit to an upper end of said work lowering unit; and
   a work discharging unit for discharging each work from a lower end of said work lowering unit out of an outlet end of said oven main body.

2. A continuous oven for baking planar works, comprising;
   an oven main body defining an oven chamber therein and provided with means for maintaining a high temperature environment inside said oven chamber;

a work lifting unit for conveying works upward inside said oven chamber with said works stacked one over the other in a mutually spaced relationship;

a work lowering unit for conveying works downward inside said oven chamber with said works stacked one over the other in a mutually spaced relationship; wherein said work lowering unit includes a plurality of work supporting shafts each disposed vertically, and adapted to be selectively turned by a certain angle around an axial line thereof, at least one of said plurality of work supporting shafts being arranged at a front end of said works and a remainder of said plurality of work supporting shafts being arranged at a rear end of said works;

a plurality of work supporting arms extending laterally from each of said work supporting shafts at prescribed elevations and at an equal interval, each of said work supporting arms having an L-shape, said work supporting arms at each same elevation being adapted to support one of said works in cooperation with each other when said work supporting shafts are turned to an operative position, and stay out of a vertical path of travel of said works when said work supporting shafts are turned to a retracted position;

a plurality of work lowering shafts each disposed vertically, and adapted to be turned by a certain angle and vertically moved by a stroke at least slightly larger than said equal interval, at least one of said plurality of work lowering shafts being arranged at the front end of said works and a remainder of said plurality of work lowering shafts being arranged at the rear end of said works; and a plurality of work lowering arms extending laterally from each of said work lowering shafts at prescribed elevations and at a same equal interval as said supporting arms, each of said work lowering arms having an L-shape, said work lowering arms at each same elevation being adapted to support one of said works in cooperation with each other when said work lowering shafts are turned to an operative position, and stay out of a vertical path of travel of said works when said work lowering shafts are turned to a retracted position;

a work charging unit provided in a lower part of one side of said oven main body for charging each work into a lower end of said work lifting unit from an inlet end of said oven main body;

a work shifting unit provided in an upper part of said oven main body for moving each work from an upper end of said work lifting unit to an upper end of said work lowering unit; and a work discharging unit for discharging each work from a lower end of said work lowering unit out of an outlet end of said oven main body.

* * * * *